United States Patent
Ysebodt et al.

(10) Patent No.: US 10,935,610 B2
(45) Date of Patent: Mar. 2, 2021

(54) ASSESSMENT OF POWERING MODES FOR DC-POWERED DEVICES

(71) Applicant: SIGNIFY HOLDING B.V., Eindhoven (NL)

(72) Inventors: Lennart Ysebodt, Retie (DE); Matthias Wendt, Würselen (DE)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/302,712

(22) PCT Filed: May 9, 2017

(86) PCT No.: PCT/EP2017/061058
§ 371 (c)(1),
(2) Date: Nov. 19, 2018

(87) PCT Pub. No.: WO2017/198498
PCT Pub. Date: Nov. 23, 2017

(65) Prior Publication Data
US 2019/0120891 A1    Apr. 25, 2019

(30) Foreign Application Priority Data

May 19, 2016   (EP) ..................................... 16170290

(51) Int. Cl.
*G01R 31/69*    (2020.01)
*G01R 31/40*    (2020.01)
(Continued)

(52) U.S. Cl.
CPC ............. *G01R 31/69* (2020.01); *G01R 31/40* (2013.01); *H02J 1/00* (2013.01); *H02M 7/06* (2013.01); *H04L 12/10* (2013.01)

(58) Field of Classification Search
CPC ........... G01R 31/69; G01R 31/40; H02J 1/00; H02M 7/06
(Continued)

(56) References Cited

U.S. PATENT DOCUMENTS

| 5,834,925 A | 11/1998 | Chesavage |
| 6,473,608 B1 | 10/2002 | Lehr et al. |

(Continued)

FOREIGN PATENT DOCUMENTS

| JP | 2009153025 A | 7/2009 |
| WO | 2007121148 A2 | 10/2007 |
| WO | 2016059435 A1 | 4/2016 |

OTHER PUBLICATIONS

Idealbridge, Dual MOSFET-Based Bridge Rectifier, Microsemi, PD70224 & PD70224L 2013 (12 Pages).

*Primary Examiner* — Michael R. Fin

(57) ABSTRACT

A power-input stage (102) for a DC-powered device (100), the power-input stage including at least four pairs of power-input elements (104) for connecting to four pairs of external electrical conductors (106) for delivering DC power, and a powering-mode assessment unit (108) having a balance measurement stage (110) that is configured to perform a balance measurement for determining whether or not a first number of pairs of power-input elements, at which a positive power-supply voltage is available from the external electrical conductors, is equal to a second number of pairs of power-input elements, from which a negative power-supply voltage is available, and to provide a balance output signal indicative of a result of the balance measurement.

13 Claims, 7 Drawing Sheets

(51) Int. Cl.
  *H02J 1/00* (2006.01)
  *H02M 7/06* (2006.01)
  *H04L 12/10* (2006.01)

(58) Field of Classification Search
  USPC .......................................................... 307/125
  See application file for complete search history.

(56) References Cited

U.S. PATENT DOCUMENTS

| | | | |
|---|---|---|---|
| 8,839,008 B2* | 9/2014 | Maniktala | H02J 1/00 307/80 |
| 9,634,844 B2* | 4/2017 | Paul | G06F 1/26 |
| 2007/0021094 A1* | 1/2007 | Elkayam | H04L 12/10 455/402 |
| 2007/0281755 A1 | 12/2007 | Dwelley | |
| 2010/0037093 A1 | 2/2010 | Biederman et al. | |
| 2010/0205466 A1 | 8/2010 | Diab et al. | |
| 2011/0163605 A1 | 7/2011 | Ronen et al. | |
| 2013/0257161 A1 | 10/2013 | Ferentz et al. | |
| 2015/0035365 A1 | 2/2015 | Picard et al. | |
| 2015/0215131 A1 | 7/2015 | Paul et al. | |
| 2015/0326403 A1 | 11/2015 | Dwelley et al. | |

* cited by examiner

ASSESSMENT OF POWERING MODES FOR DC-POWERED DEVICES

Cross-Reference to Prior Applications

This application is the U.S. National Phase application under 35 U.S.C. § 371 of International Application No. PCT/EP2017/061058, filed on May 9, 2017, which claims the benefit of European Patent Application No. 16170290.7, filed on May 19, 2016. These applications are hereby incorporated by reference herein.

FIELD OF THE INVENTION

The present invention relates to a power-input stage for a DC-powered device, to a power-limit measurement device for assessment of a mode of DC-power delivery, to a DC-powered device, to a method for detecting a mode of power delivery, to a method for operating a DC-powered device and to a computer program.

BACKGROUND OF THE INVENTION

US 2015/0215131 A1 presents an electrical arrangement consisting of a DC power sourcing equipment (PSE) and a DC-powered device (PD). The PSE is configured to detect whether the PD is compatible for receiving power via four wire pairs (e.g. in a standard Ethernet cable). During the detection phase, the PSE provides a current limited voltage to a first and a second pair or conductors in the cable, to detect a characteristic impedance of the PD. In the PSE, a first resistor is connected to a third conductor pair and a second resistor is connected to a forth conductor pair. During the detection phase, the PSE detects the relative currents through the resistors. If the currents are the same, the PSE knows the PD is able to receive power via the four conductor pairs. The PSE then applies the full voltage to the first and the second conductor pairs and connects the third and forth conductor pairs to a low voltage via a MOSFET.

US 2007/0281755 A1 presents novel techniques for balancing power or current drawn from multiple power supply inputs by controlling switching circuits associated with the respective power supply inputs. Each switching circuit may be controlled so as to limit current in its transformer or inductor in each switching cycle to a peak or average current value common to all switching circuits.

SUMMARY OF THE INVENTION

While it is advantageous to have a power source configured to determine if the connected powered device is capable of receiving power via the conductor pairs, it would also be beneficial for the DC-powered device to be able to determine if the power supplied by an external power source, belongs a valid or correct powering mode, before it extracts power form the source for its operation.

It is an object of the present invention to enable a DC-powered device to detect if it is receiving DC-power in a valid or correct powering mode, before if draws power from an external power source for the operation of a load device.

According to a first aspect of the present invention, a power-input stage for a DC-powered device is presented. The power-input stage includes:
a connection unit comprising at least four pairs of power-input elements (104) for connecting to the same number of pairs of external electrical conductors (106) for delivering DC power, and a powering-mode assessment unit, having a balance measurement stage. The balance measurement stage is configured to perform a balance measurement for determining whether or not a first number of pairs of power-input elements, at which a positive power-supply voltage is available from the external electrical conductors, is equal to a second number of pairs of power-input elements, from which a negative power-supply voltage is available, and to provide a balance output signal indicative of a result of the balance measurement.

The power-input stage of the first aspect of the present invention is advantageously configured to determine a powering mode by which it is currently being powered. Pairs of external conductors for delivering DC power can be connected to the connection unit by means of the pairs of power-input elements.

By comparing the first number of pairs of power-input elements (i.e., those at which a positive power-supply voltage is available) to the second number of pairs of power-input elements (i.e., those at which a negative power-supply voltage is available), the DC-powered device is able to exclude or confirm that it is currently being powered over an uneven number such as 3 pairs of external electrical conductors, no power being delivered over the remaining pairs of power-input elements, or if it is receiving a so called "false" power. A non-limiting example of this case is "false 4-pair power" in the case of a total number of four pairs of power-input elements. False 4-pair power describes either the connection of three pairs of external electrical conductors at which a positive power supply voltage is available and one pair of external electrical conductors at which a negative power supply voltage is available or the connection of one pairs of external electrical conductors at which a positive power supply voltage is available and three pair of external electrical conductors at which a negative power supply voltage is available.

The following table includes an incomplete list of powering configurations for four-pairs of power-input elements (pair 1, pair 2, pair 3 and pair 4) which can be either connected to a positive voltage (+), to a negative voltage (−) or not connected (Z). The table shows the most relevant powering configurations. The remaining configurations are obtained by swapping (+) and (−), by swapping pair 1 and pair 2, by swapping pairs 1 and 2 with pairs 3 and 4 or any combination thereof.

TABLE 1

Powering Configurations for an example of 4 pairs of power input elements

| Configuration | Pair 1 | Pair 2 | Pair 3 | Pair 4 |
| --- | --- | --- | --- | --- |
| 1 | + | − | + | − |
| 2 | + | + | − | − |
| 3 | + | + | + | − |
| 4 | + | − | + | Z |
| 5 | + | − | Z | − |
| 6 | + | + | − | Z |
| 7 | + | − | Z | Z |
| 8 | Z | Z | + | − |
| 9 | + | Z | − | Z |

Configuration number 1 and configuration number 2 are correct powering modes providing 4-pair power. Two pairs of power-input elements receive positive voltage, while the remaining two pairs receive negative voltage. The polarities may be inverted in any combination. In configuration number 3, all four pairs of power-input elements are connected to the power supply, but 3 pairs receive positive voltage, and one receives negative voltage. This is called false 4-pair power, because it puts very high stresses on a current path that is connected with only a single pair back to the source. Also here polarities may be inverted, or pair positions swapped. While this configuration is technically providing power over 4 pairs of conductors, it is in fact only capable of safely transferring the amount of power that can safely be transported over 2 pairs of conductors.

Configurations 4 through 6 are variants of "3-pair power", where one pair is not connected to the source. 3-pair power could easily be confused by a naive circuit for 4-pair power, but power consumption is not allowed to be higher than what is allowed for 2-pair power.

Finally, configurations 7 through 9 show correct 2-pair powering modes.

The power input stage is thus configured to determine, for example in the case of four pairs of power-input elements, if the powering configuration corresponds either to a correct 4-pair powering mode or a correct 2-pair powering mode (i.e. the first number of pairs of power-input elements, at which a positive power-supply voltage is available from the external electrical conductors, is equal to a second number of pairs of power-input elements, from which a negative power-supply voltage is available), or alternatively to a false 4-pair powering mode or to a 3-pair power mode (i.e. the first number of pairs of power-input elements, at which a positive power-supply voltage is available from the external electrical conductors, is not equal to a second number of pairs of power-input elements, from which a negative power-supply voltage is available). It further provides a balance output signal that is indicative of the result of the balance measurement.

In case of an uneven total number of pairs of power-input elements, a balanced or correct powering mode requires that an uneven number of pairs smaller than the total number of pairs is not connected.

In the following, embodiments of the first aspect of the present invention will be presented.

It would be also beneficial to be able to distinguish if a correct powering mode is based on a provision of the power via all of the pairs of external electrical conductor pairs or via a smaller even number of conductor pairs. In the non-limiting case of four pairs of external electrical conductors, a correct 4-pair powering mode or a correct 2-pair powering mode may be present. However, the amount of power allowed for delivery via two pairs of external electrical conductors is typically lower than the amount of power allowed for delivery via four pairs of external electrical conductors. Therefore, in some embodiments, the powering-mode assessment unit further comprises a power-limit measurement stage. The power-limit measurement stage is configured to perform a power-limit measurement indicative of a maximum amount of DC power allowed for provision via the external electrical conductors and to provide a power output signal indicative of a result of the power-limit measurement. The power output signal thus includes data pertaining to the correct powering mode.

In some of these embodiments, the power-input stage unit is configured to perform the power-limit measurement only in case the balance output signal indicated that the fist number of pairs of power-input elements is equal to the second number of pairs of power-input elements.

In other embodiments, the balance measurement unit comprises two voltage dividers, each having a pair of inputs connected to a respective pair of power-input elements and having respective center point taps. Additionally these embodiments comprise a voltage sensor connected to the center point taps and configured to measure a center point voltage provided between the center point taps and a reference voltage or potential. If further provides the center point voltage as the balance output signal.

In these embodiments, whenever the number of pairs of power-input elements at which a positive power-supply voltage is available is equal to the number of pairs of power-input elements at which a negative power-supply voltage is available, the center point voltage measured by the voltage sensor corresponds to a voltage value within a predetermined voltage range. Measured center point voltages with voltage values outside the predetermined voltage range are therefore an indication of incorrect powering modes.

In some embodiments, a resistive voltage divider comprising two resistors is used. In some of these embodiments, and in order to reduce high frequency noise getting coupled into the center point voltage measurement, an inductor can be put in series with the resistors. In other embodiments a grounded decoupling capacitor can be connected to the center point taps. In some embodiments, both the inductors and the capacitors are simultaneously used.

In some embodiments of the first aspect, the power-limit measurement stage comprises a capacitance connected on its one side to the voltage sensor and a controllable switch that is suitably configured to temporarily connect the other side of the capacitance to a reference potential. The power-limit measurement stage is then configured to determine the total amount of DC power available based on measuring a rate change of the center point voltage in response to connecting the capacitance to the reference potential. In these embodiments, once the controllable switch is operated and closes the electrical circuit, the capacitance will be pulled to the reference potential (e.g. ground) and then begin to charge back up to its previous charge value. By measuring the rate of the voltage increase at the voltage sensor, the number of pairs of power-input elements at which a positive power supply voltage is available is determined.

In other embodiments, the power-limit measurement stage comprises a measurement resistor connected on its one side to the voltage sensor and a controllable switch that is suitably configured to temporarily connect the other side of the measurement resistor to a reference potential. The power-limit measurement stage is then configured to determine the total amount of DC power available based on measuring the center point voltage in response to connecting the measurement resistor to the reference potential. In these embodiments, the current flowing through the measurement resistor once the switch is operated to connect it to the reference potential (e.g. ground potential) is proportional to the number of pairs of power-input elements at which a positive power supply voltage is available.

In some embodiments of the first aspect, the voltage dividers of the balance measurement unit further comprise zener-diodes (Z-diodes) facing each other in series ("anti-serialized") and respectively connected between the respective power-input element and the center point of the voltage divider. These embodiments are advantageously configured to improve the detection of a DC-powered device signature in e.g. Power over Ethernet applications, where a power is only applied after a successful detection of the DC-powered device by a power sourcing equipment. The detection of the signature can be skewed if the resistance value of resistors forming the voltage divided is too low. Furthermore, very high impedance resistors also present design problems. Adding Z-diodes to the voltage divider hides the voltage divider for voltages below a predetermined detection value. As soon as power intended to operate the DC-powered device (higher than the power delivered to detect the presence of the DC-powered device) is applied, the Z-diodes will turn on and the power input stage will operate as expected. In an alternative embodiment, diacs are used instead of anti-serialized zener-diodes. Diacs do not conduct until they see a trigger voltage across. After they are fired, diacs show only very low voltage drop, which is a characteristic that distinguishes diacs from zener-diodes. Therefore, at low voltages, which are for instance typically required for PoE negotiation, diacs are "invisible" and will nearly act like 0-Ohm resistors for PoE supply voltages. The additional benefit is that the characteristic curve of the current as a function of voltage of a diac is symmetrical, so only one device is required per leg.

According to a second aspect of the present invention, a device for assessment of a mode of DC-power delivery from an external DC power sourcing equipment via at least four pairs of electrical conductors is presented. The device comprises a power-input stage according to the first aspect of the present invention and a user interface that is connected with the power-input stage and configured to receive the balance output signal and to provide a user output in dependence of a value of the balance output signal.

The device of the second aspects represents a stand-alone implementation that comprises the power-input stage of the first aspect of the invention or one of its embodiments. It can for instance be implemented as a handheld diagnostic tool to check cables, DC-powered devices and/or DC power-source devices for correct operation.

According to a third aspect of the present invention, a DC-powered device is presented. The DC-powered device comprises a power input-stage according to the first aspect, a load unit configured to receive DC power via the power-input stage and use the DC power in operation of the DC-powered device, and a control unit configured to receive the balance output signal and to determine and set an operating mode of the load unit in dependence of the balance output signal.

In some embodiments of the third aspect, the control unit is configured to determine and set:
a first operating mode of the load unit requiring at least a first predetermined power amount in case the first number of pairs of power-input elements, at which the positive power-supply voltage is available from the external electrical conductors, is equal to the second number of pairs of power-input elements, from which the negative power-supply voltage is available;
a second operating mode of the load unit requiring a second power amount smaller than the first power amount or to shut down operation of the load unit in case the balance output signal indicates that the mentioned first number of pairs of power-input elements is not equal to the second number of pairs of power-input elements.

The first operating mode occurs when the DC-powered device is powered according to a correct powering mode (e.g. 2-pair or 4-pair powering modes in the non limiting example of four pairs of power-input elements). The DC-powered device then draws from the power supply the power necessary for the operation of the load unit.

The second operation mode occurs when the DC-powered device is not powered according to a correct powering mode. This is for example the case of an incorrect 3-pair powering mode or an incorrect false 4-pair powering mode. In the case of an occurrence of an uneven powering mode (e.g., 3 pair powering mode), power consumption should not be allowed to be higher than what is allowed for a correct even (e.g., 2-pair) powering mode. In the case of an occurrence of a false 4-pair powering mode, the DC-powered device is in fact only capable of safely receiving the amount of power that can be safely transported over two pairs of conductors.

In case the reduced power available from two pairs of conductors is not sufficient to operate the load unit, some embodiments of the DC-powered device are advantageously configured to shut down the operation of the load unit until enough power in provided in a correct powering mode.

According to a forth aspect of the present invention, a method for detecting a mode of power delivery by an external DC power sourcing equipment via at least four pairs of external electrical conductors is presented. The method comprises:
performing a balance measurement for determining whether or not a first number of pairs of external electrical conductors, from which a positive power-supply voltage is available, is equal to a second number of pairs of external electrical conductors, from which a negative power-supply voltage is available, and
providing a balance output signal indicative of a result of the balance measurement.

The method shares the advantages of the power-input stage of the first aspect of the present invention.

In some embodiments of the method of the forth aspect, the method further comprises
performing, only in case the balance output signal indicates that the first number is equal to the second number, a power-limit measurement for determining a total amount of DC power available via the external electrical conductors; and
providing a power output signal indicative of a result of the power-limit measurement.

According to a fifth aspect of the present invention, a method for operating a DC-powered device having a DC power input unit comprising at least four pairs of power-input elements is presented. The method comprises:
performing a method according to the forth aspect of the present invention;
determining and setting an operating mode of the DC-powered device in dependence on the balance output signal.

In some embodiments of the fifth aspect, the method further comprises determining and setting
a first operating mode of the load unit requiring at least a first predeter-mined power amount in case the balance output signal indicates that the first number is equal to the second number;
a second operating mode of the load unit requiring a second power amount smaller than the first power amount, or to shut down operation of the load unit, in case the balance output signal indicates that the first number is not equal to the second number.

According to a sixth aspect of the present invention a computer program is presented. The computer program comprises executable code for executing a method for operating a DC-powered device according to the fifth aspect of the present invention when executed by a processor of a computer. The computer program shares the advantages of the method of the fifth aspect.

The above-described embodiments of the different aspects of the invention can for instance be used in the context of a Power-over-Ethernet technology and is most suitable for implementing PoE powered devices (PDs) or PD diagnostic tools that comply to the coming 802.3bt standard.

It shall be understood that the power-input stage for a DC-powered device of claim 1, the power-limit measurement device for assessment of a mode of DC-power delivery of claim 8, the DC-powered device of claim 9, the method for detecting a mode of power delivery of claim 11, the method for operating a DC-powered device of claim 13 and the computer program of claim 15 have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Without limitation, the embodiments described in the following refer to application cases, in which four pairs of electrical conductors are present for delivering DC power. Such application cases are for instance suitable for implementation in the context of a Power-over-Ethernet technology for implementing PoE powered devices (PDs) or PD diagnostic tools, and are usefully in particular when such device are built to comply with the coming 802.3bt standard. However, this is not meant as a limitation of the applicability of the invention. Higher numbers of pairs of electrical conductors can be used in other application cases.

Figure 1:
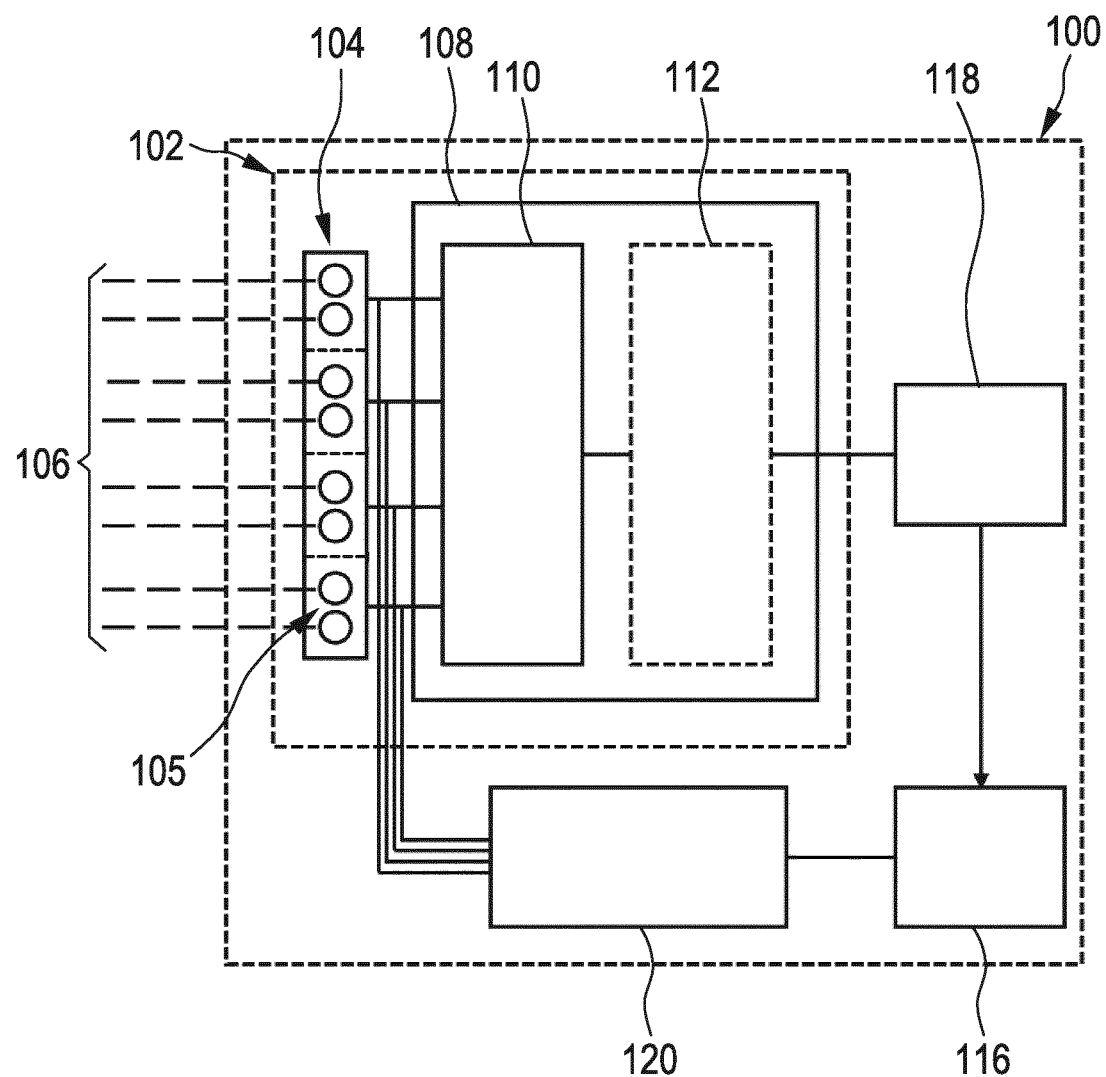
FIG. 1 represents a block diagram of an exemplary embodiment of a DC-powered device.

FIG. 1 shows a block diagram of an exemplary embodiment of a DC-powered device 100. The DC-powered device comprises a power-input stage 102 that includes a connection 104 unit comprising four pairs 105 of power-input elements for connecting to four pairs of external electrical conductors 106 for delivering DC power. It also includes a powering-mode assessment unit 108 having a balance measurement stage 110 that is configured to perform a balance measurement to determine if a first number of pairs of power-input elements at which a positive power-supply voltage is available is equal or not to a second number of pairs of power-input elements at which a negative power-supply voltage is available. It further provides a balance output signal indicative of a result of the balance measurement. Other DC-powered devices comprise a power-input stage further including a power-limit measurement stage 112 which is configured to perform a power-limit measurement indicative of a total amount of DC power available via the external electrical conductors and to provide a power output signal indicative of a result of the power-limit measurement. The DC-powered device 100 also includes a load unit 116, configured to receive DC power via the power-input stage in operation of the DC-powered device, and a control unit 118 configured to receive the balance output signal and to determine and set an operating mode of the load unit in dependence of the balance output signal. The DC power reaches the load unit 116 after passing through a rectifying unit 120 which is configured to make the DC-powered device insensitive to the polarity of a power supply. Some DC-powered devices are designed using two full diode bridges with the positive and the negative outputs shorted together. Other embodiments present MOSFET bridges instead of diode bridges. Other embodiments include a combination of MOSFET and diode bridges.

Figure 2:
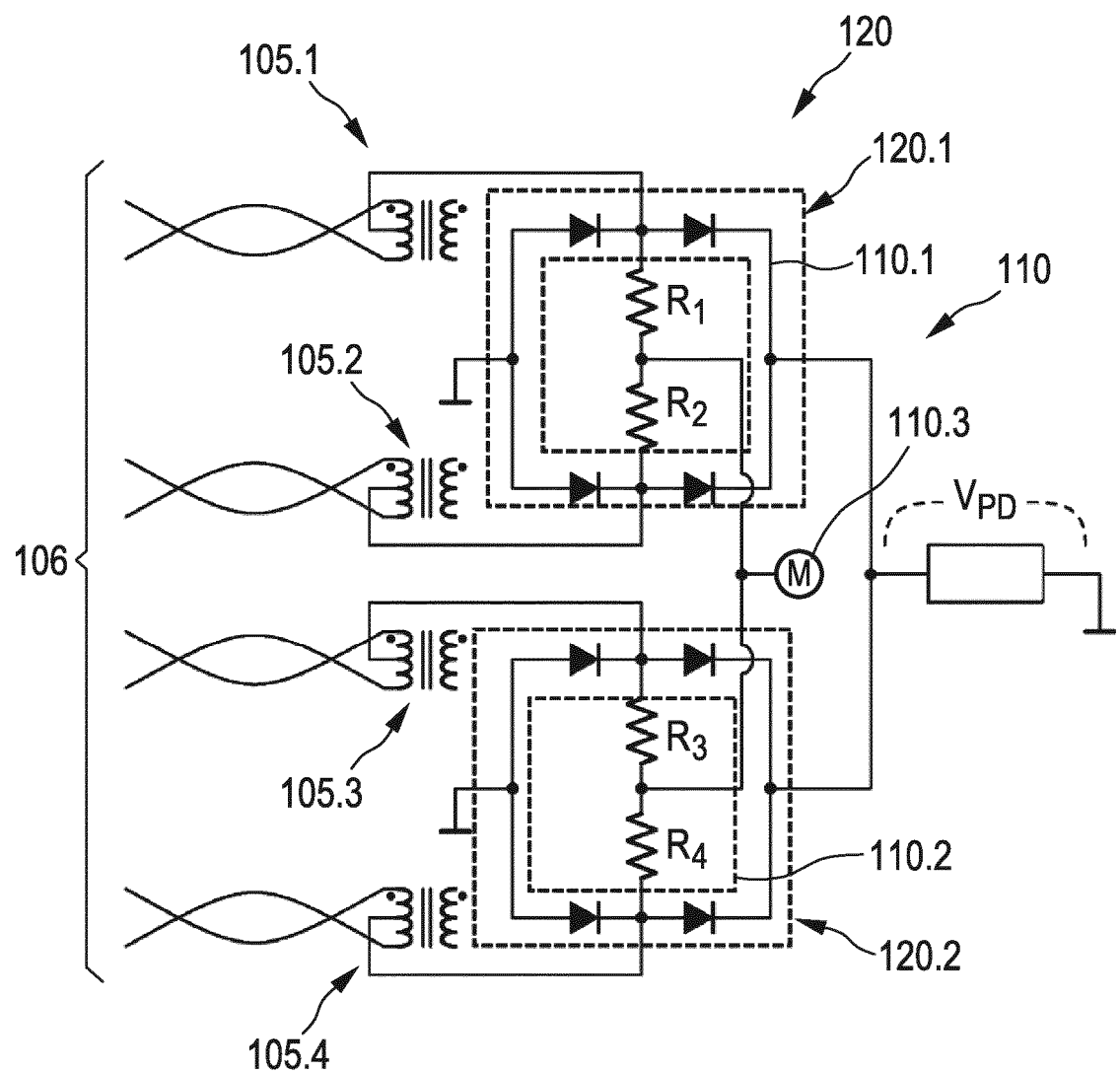
FIG. 2 represents a schematic circuit diagram of an exemplary DC-powered device.

FIG. 2 shows a schematic circuit diagram of an exemplary DC-powered device that includes an input-power stage having a balance measurement unit 110 configured to perform a balance measurement. The balance measurement unit comprises two voltage dividers 110.1 and 110.2, formed by resistors R1 and R2, and by resistors R3 and R4, respectively, and a voltage sensor 110.3 (also labeled M). The voltage dividers 110.1 and 110.2 are in this case resistive voltage dividers, although other DC-powered devices include other kinds of voltage dividers such as low-pass RC filters. Each voltage divider has a pair of inputs connected with a respective pair of power-input elements (e.g. the first voltage divider has R1 connected to 105.1 and R2 connected to 105.2) and has a respective center point tap connect to the voltage sensor 110.3. The voltage sensor 110.3 is configured to measure a center point voltage provided between the center point tap and a reference voltage. In this case, measurements at M are taken with respect to ground, which is the negative output of the rectifying unit 120, which in the present embodiment is formed by diode rectifiers 120.1 and 120.2. The diode rectifiers are, in some DC-powered devices, partially or totally replaced by MOSFET-based bridge rectifiers.

In some devices, and in order to reduce high frequency noise getting coupled in to measurement point M, either an inductor is put in series with the measurement resistors, or a decoupling capacitor is placed between M and ground, or both.

Whenever the number of pairs connected to the positive voltage is equal to the numbers of pairs connected to the negative voltage, the voltage at M (measured with respect to a reference potential or reference voltage, e.g., ground potential) is about half of the voltage between the positive output of the bridge rectifier and the negative output of the bridge rectifier (this voltage is called $V_{PD}$). Any application of "3 pair" power, or the application of three positive and one negative pair or three negative and one positive pair, can be detected. In this case the voltage at M will be higher or lower than half of $V_{PD}$. An alternative is to measure against a reference voltage $V_{PD}/2$ which can be generated by a resistor divider between the ground potential and the $V_{PD}$ output of the rectifier. In such a case any voltage different from zero is indicative for a non-balanced connection.

The following table shows the resulting voltage at M, based on the number of pairs of power-input elements connected to positive supply voltage (+) and negative supply voltage (−), for a device having four pairs of power-input elements (e.g. 105.1, 105.2, 105.3 and 105.4). The unconnected pairs of power-input elements do not impact the voltage measured at M.

| Number of (+) connections | Number of (−) connections | Voltage measured at M | Powering mode |
|---|---|---|---|
| 4 | 0 | $V_{PD}$ | unbalanced mode |
| 3 | 1 | $\frac{3}{4} * V_{PD}$ | unbalanced mode |
| 2 | 2 | $\frac{1}{2} * V_{PD}$ | Balanced powering mode 4-pair powering mode |
| 1 | 3 | $\frac{1}{4} * V_{PD}$ | unbalanced mode |
| 0 | 4 | 0 | unbalanced mode |
| 3 | 0 | $V_{PD}$ | unbalanced mode |
| 2 | 1 | $\frac{2}{3} * V_{PD}$ | unbalanced mode |
| 1 | 2 | $\frac{1}{3} * V_{PD}$ | unbalanced mode |
| 0 | 3 | 0 | unbalanced mode |
| 2 | 0 | $V_{PD}$ | unbalanced mode |
| 1 | 1 | $\frac{1}{2} * V_{PD}$ | Balanced powering mode 2-pair mode |
| 0 | 2 | 0 | unbalanced mode |
| 1 | 0 | $V_{PD}$ | unbalanced mode |
| 0 | 1 | 0 | unbalanced mode |

Based on the balance output signal, the DC-powered device knows that it is in one of the following powering modes:

A balanced powering mode, wherein two pairs of power-input elements are connected to a positive voltage and the other two pairs are connected to a negative voltage (the so-called 4-pair powering mode), or wherein one pair of power-input elements is connected to a positive voltage and the another pair is connected to a negative voltage (the so-called 2-pair powering mode). These powering modes are considered "correct"

An unbalanced powering mode, wherein either a variant of a 3-pair powering mode or a false 4-pair powering mode has been applied. These powering modes are considered "incorrect"

If the DC-powered device is powered by a correct powering mode, some power-input stages comprising a powering-mode assessment unit are further configured to distinguish between the so-called 4-pair and the 2-pair powering mode. Two different and exemplary variants of the powering-mode assessment units are shown in FIGS. 3 and 4.

Figure 3:
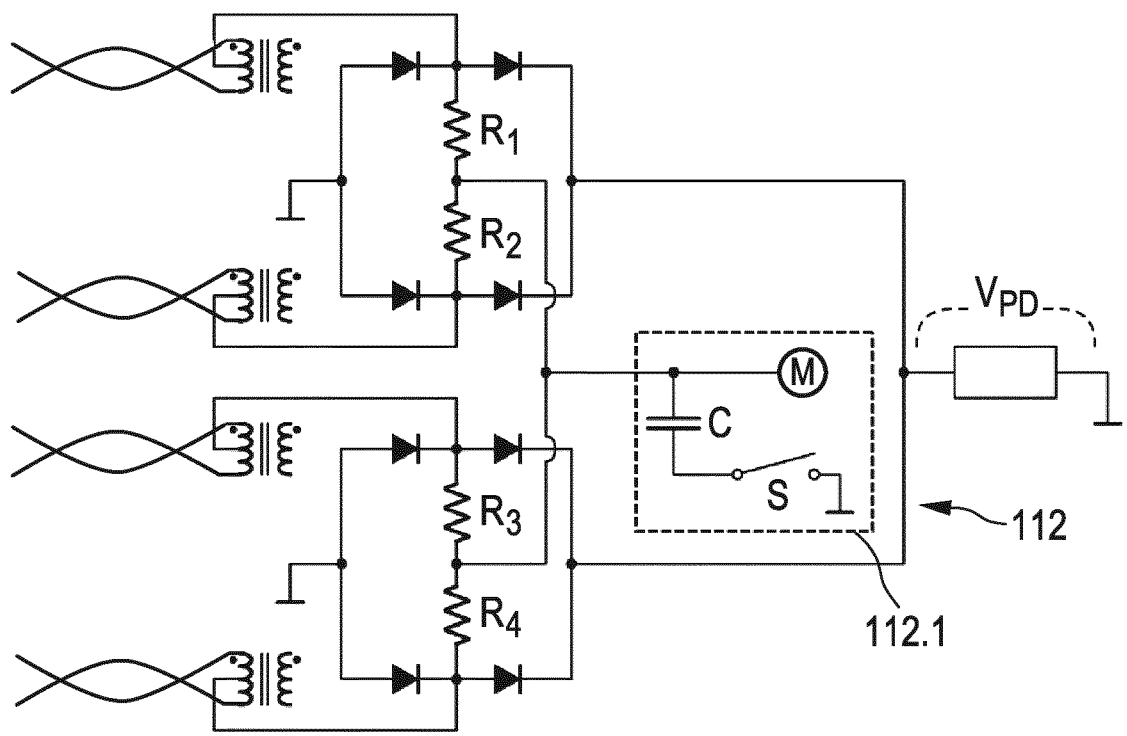
FIG. 3 represents a schematic circuit diagram of another exemplary DC-powered device.

FIG. 3 shows a DC-powered device comprising a powering-mode assessment unit 112.1 which includes a capacitor C connected on its one side to the measuring point M and a controllable switch S, for temporarily connecting the other side of the capacitor to ground. The power-limit measurement unit 112.1 is configured to determine the total amount of DC power available based on measuring a rate change of the of the center point voltage in response to connecting the capacitor C to the reference potential (i.e. ground potential) during the time of charging the capacitor C. The capacitor is connected in series with the switch S from the measurement point M to ground. For allowing repeated measurements after the capacitor has been charged once, either a highly resistive discharge resistor or a discharge switching means can be introduced across the capacitor (both alternatives not shown in FIG. 3), in order to allow starting any test with the capacitor C in its discharged state. By switching on the capacitor C, M will be pulled to ground and then begin to charge back up to it's previous value of around half of $V_{PD}$. This charging is done through resistors R1, R2, R3, and R4, whichever are connected to the positive voltage. By measuring the rate of voltage increase of M, the number of positive connected pairs can be found.

Figure 4:
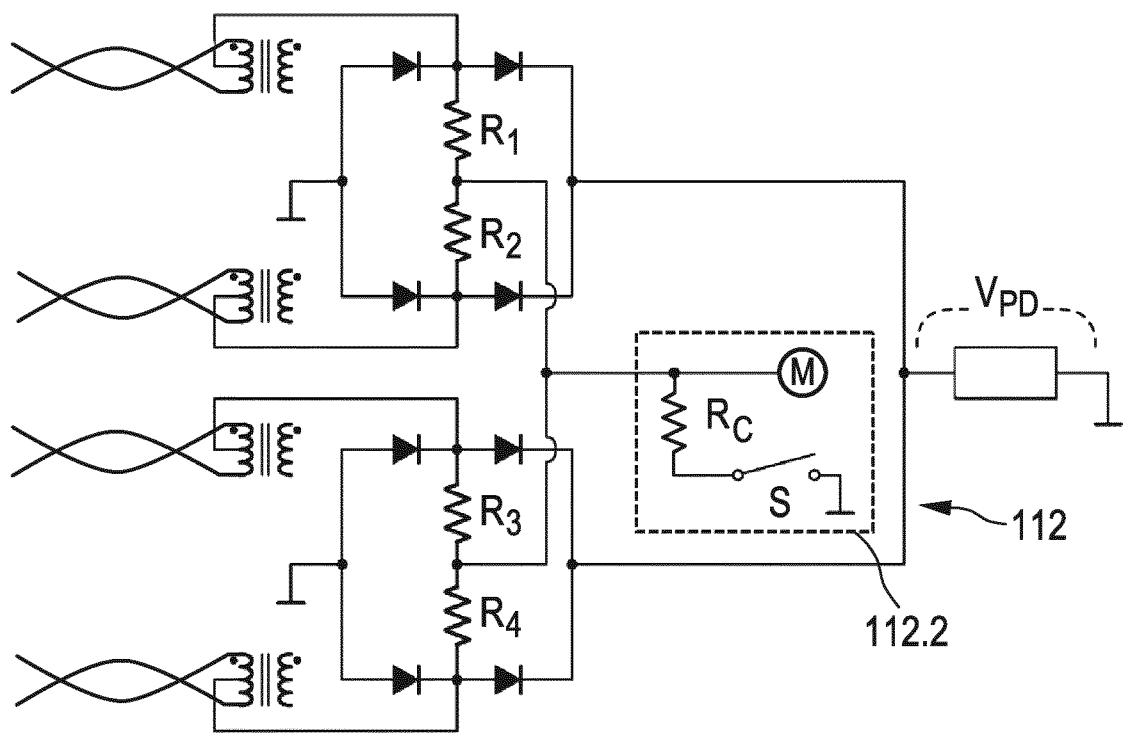
FIG. 4 represents a schematic circuit diagram of another exemplary DC-powered device.

Alternatively, the powering-mode assessment unit includes in other DC-powered devices, such as the one depicted in FIG. 4, a measurement resistor $R_C$ instead of the capacitor C, as shown in 112.2. Here, by turning switch S on, the voltage at M will be pulled toward ground by the combination of $R_C$ and S. By choosing an appropriate value for $R_C$ the voltage at M will be proportional to the amount of positive pairs that is connected to the diode rectifiers input bridges. The current that will flow through $R_C$ will be double if there are two positive pairs, than if there is only one. After performing the first measurement, the alternative second measurement also allows to determine if the system is correctly powered by a 4-pair or 2-pair powering mode.

Figure 5:
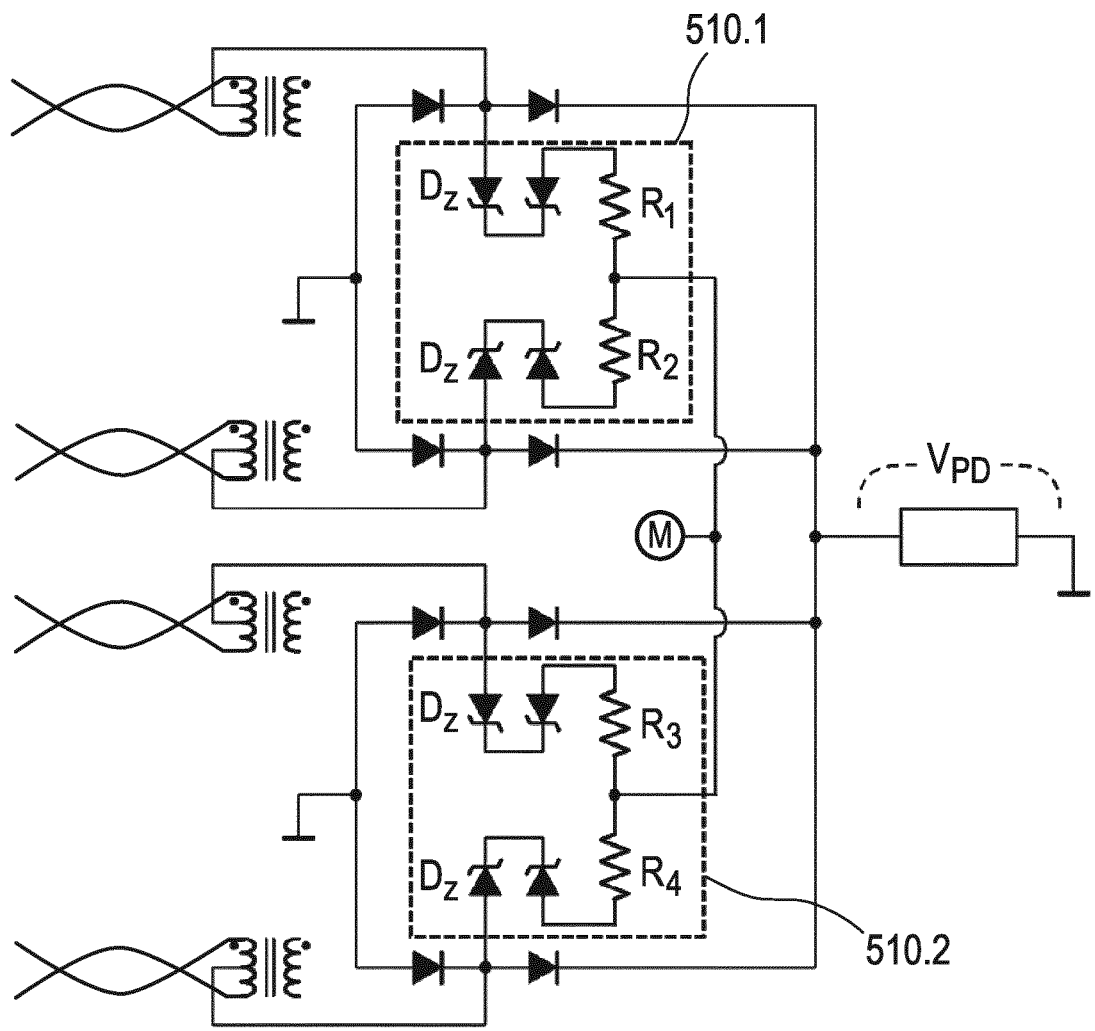
FIG. 5 represents a schematic circuit diagram of another exemplary DC-powered device.

Some of these devices are advantageously configured and arranged to be used in the frame of Power over Ethernet (PoE) technology. In PoE, DC power from a power sourcing equipment (PSE) is only applied to the DC-powered device after it has been successfully detected by the PSE, in order to avoid providing power to lose connectors. This involves the PSE applying low voltages (less than 10V), to verify if the PD shows a predetermined detection signature (e.g. 25 kΩ). The power-input stage proposed in this invention adds resistance in parallel to the pairs. This can skew the results of detection if resistors are used that are too low ohmic. At the same time, very high impedance resistors are problematic in designs as well. A solution is to add Z-diodes or Zener diodes $D_z$ to the balance measurement unit in its branches 510.1 and 510.2 in order to make it "invisible" for voltages below the detection voltage. As soon as power is applied, the zener diodes $D_z$ will turn on and the circuit will operate is usual. This is shown schematically in FIG. 5. Back to back zener diodes are installed between the rectifier input and the measurement resistors R1 through R4. This needs to be done symmetrically to maintain the polarity insensitivity of the circuit.

Figure 6:
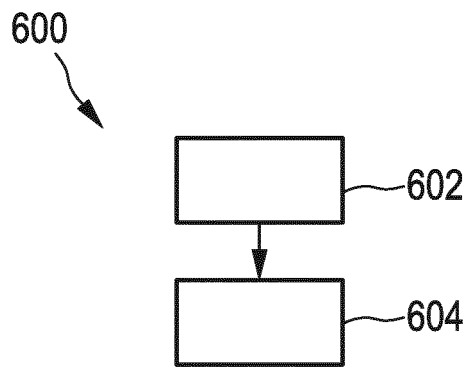
FIG. 6 represents a flow diagram of an exemplary method for detecting a mode of power delivery.
Figure 7:
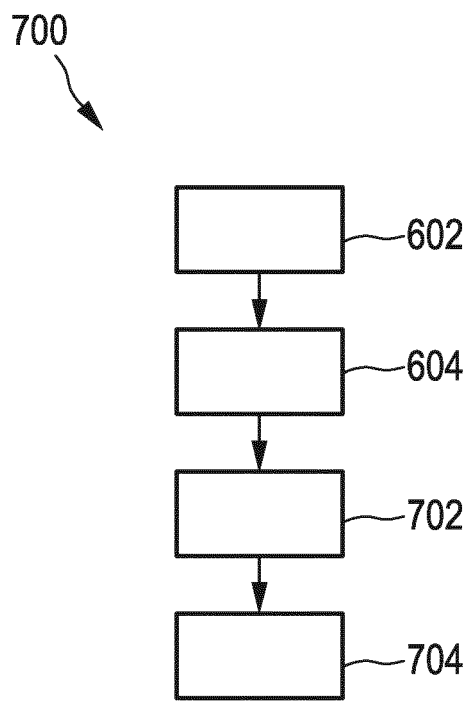
FIG. 7 represents a flow diagram of another exemplary method for detecting a mode of power delivery.

FIG. 6 shows a flow diagram of an exemplary method 600 for detecting a mode of power delivery by an external DC power sourcing equipment via at least four pairs of external electrical conductors. The method performs in a step 602 a balance measurement for determining whether or not a first number of pairs of external electrical conductors, from which a positive power-supply voltage is available, is equal to a second number of pairs of external electrical conductors, from which a negative power-supply voltage is available, and then provides, in a step 604, a balance output signal indicative of a result of the balance measurement. Other methods, such as method 700, shown in FIG. 7, further perform, in a step 702, a power-limit measurement for determining a total amount of DC power available via the external electrical conductors and then provide, in a step 704 a power output signal indicative of a result of the power-limit measurement.

Figure 8:
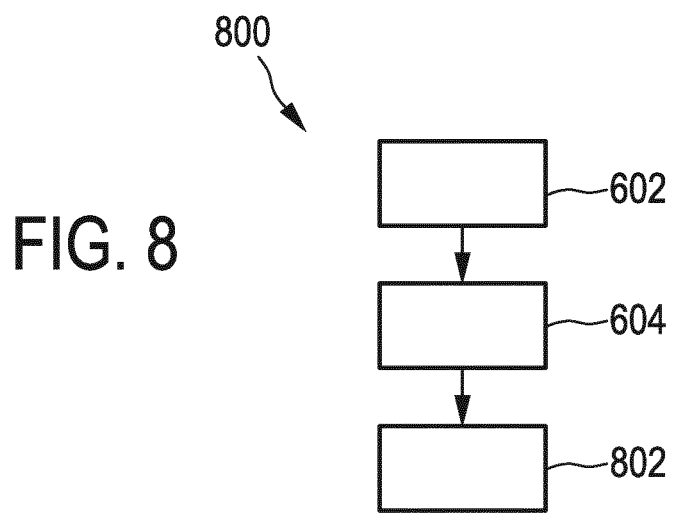
FIG. 8 represents a flow diagram of an exemplary method for operating a DC-powered device.

FIG. 8 shows a flow diagram of an exemplary method 800 for operating a DC-powered device having a DC power input unit comprising at least four pairs of power-input elements. The method 800, after performing the steps of method 600, determines and sets, in a step 802, an operating mode of the DC-powered device in dependence of the balance output. In some methods, the operating mode are either a first operating mode of the load unit requiring at least a first predetermined power amount in case the balance output signal indicates that the first number is equal to the second number (e.g. the DC-powered device is powered by a correct powering mode) or a second operating mode of the load unit requiring a second power amount smaller than the first power amount, or to shut down operation of the load unit, in case the balance output signal indicates that the first number is not equal to the second number.

In the claims, the word "comprising" does not exclude other elements or steps, and the indefinite article "a" or "an" does not exclude a plurality.

A single step or other units may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A power-input stage for a DC-powered device, the power-input stage comprising:
    a connection unit comprising at least four pairs of power-input elements for connecting to the same number of at least four pairs of external electrical conductors for delivering DC power; and
    a powering-mode assessment unit having a balance measurement stage that is configured to perform, before power is drawn for operation of the DC-powered device, a balance measurement for determining whether or not a first number of pairs of power-input elements, at which a positive power-supply voltage is available from the external electrical conductors, is equal to a second number of pairs of power-input elements, from which a negative power-supply voltage is available, and to provide a balance output signal indicative of a result of the balance measurement, wherein the balance measurement unit comprises two voltage dividers, each having a pair of inputs connected with a respective pair of power-input elements, and having respective center point taps, and a voltage sensor connected to the center point taps and configured to measure a center point voltage provided between the center point taps and a reference voltage and to provide the center point voltage as the balance output signal.

2. The power-input stage of claim 1, wherein the powering-mode assessment unit further comprises a power-limit measurement stage which is configured to perform a power-limit measurement indicative of a maximum amount of DC power allowed for provision via the external electrical conductors and to provide a power output signal indicative of a result of the power-limit measurement.

3. The power-input stage of claim 2, which is configured to perform the power-limit measurement only in case the balance output signal indicates that the first number is equal to the second number.

4. The input stage of claim 1, wherein the power-limit measurement stage comprises:
    a capacitance connected on its one side to the voltage sensor, and
    a controllable switch for temporarily connecting the other side of the capacitance to a reference potential; wherein the power-limit measurement stage is configured to determine the maximum amount of DC power allowed based on measuring a rate change of the of the center point voltage in response to connecting the capacitance to the reference potential.

5. The input stage of claim 1, wherein the power-limit measurement stage comprises:
    a measurement resistor connected on its one side to the voltage sensor, and
    a controllable switch for temporarily connecting the other side of the measurement resistor to a reference potential, wherein the power-limit measurement stage is configured to determine the total amount of DC power available based on measuring the center point voltage in response to connecting the measurement resistor to the reference potential.

6. The input stage of claim 1, wherein the voltage dividers of the balance measurement unit comprise diacs or an arrangement of Zener-diodes facing each other in series and respectively connected between the respective power-input element and the center point of the voltage divider.

7. A DC-powered device, comprising:
    a power-input stage according to claim 1; and
    a load unit, configured to receive DC power via the power-input stage in operation of the DC-powered device; and
    a control unit configured to receive the balance output signal, and to determine and set an operating mode of the load unit in dependence on the balance output signal.

8. The DC-powered device according to claim 7, wherein the control unit is configured to determine and set:
    a first operating mode of the load unit requiring at least a first predetermined power amount in case the balance output signal indicates that the first number is equal to the second number; and
    a second operating mode of the load unit requiring a second power amount smaller than the first power amount, or to shut down operation of the load unit, in case the balance output signal indicates that the first number is not equal to the second number.

9. A method for detecting a mode of power delivery by an external DC power sourcing equipment via four pairs of external electrical conductors corresponding to at least four pairs of power-input elements for connecting to the at least four pairs, the method comprising:
    performing, by a balance measurement unit comprising two voltage dividers, each having a pair of inputs connected with a respective pair of power-input elements, and having respective center point taps, and a voltage sensor connected to the center point taps, and before power is drawn for operation of the DC-powered device, a balance measurement for determining whether or not a first number of pairs of external electrical conductors, from which a positive power-supply voltage is available, is equal to a second number of pairs of external electrical conductors, from which a negative power-supply voltage is available, wherein the balance measurement unit is configured to measure a center point voltage provided between the center point taps and a reference voltage and to provide the center point voltage as the balance output signal; and
    providing a balance output signal indicative of a result of the balance measurement.

10. The method of claim 9, further comprising:
    performing, only in case the balance output signal indicates that the first number is equal to the second number, a power-limit measurement for determining a total amount of DC power available via the external electrical conductors; and
    providing a power output signal indicative of a result of the power-limit measurement.

11. A method for operating a DC-powered device having a DC power input unit comprising at least four pairs of power-input elements, the method comprising:
    performing a method according to claim 9;
    determining and setting an operating mode of the DC-powered device in dependence on the balance output signal.

12. The method of claim 11, further comprising determining and setting:

a first operating mode of the load unit requiring at least a first predetermined power amount in case the balance output signal indicates that the first number is equal to the second number; and a second operating mode of the load unit requiring a second power amount smaller than the first power amount, or to shut down operation of the load unit, in case the balance output signal indicates that the first number is not equal to the second number.

13. A computer program comprising executable code for executing a method for operating a DC-powered device according to claim 11 when executed by a processor of a computer.

* * * * *